(12) United States Patent
Terao et al.

(10) Patent No.: US 8,557,015 B2
(45) Date of Patent: Oct. 15, 2013

(54) CR-CU ALLOY, METHOD FOR PRODUCING THE SAME, HEAT-RELEASE PLATE FOR SEMICONDUCTOR, AND HEAT-RELEASE COMPONENT FOR SEMICONDUCTOR

(75) Inventors: Hoshiaki Terao, Niigata (JP); Hiroki Ota, Tokyo (JP); Hideaki Kobiki, Tokyo (JP); Satoshi Uenosono, Tokyo (JP); Aya Uenosono, legal representative, Osaka (JP)

(73) Assignees: JFE Precision Corporation (JP); JFE Steel Corporation (JP)

( * ) Notice: Subject to any disclaimer, the term of this patent is extended or adjusted under 35 U.S.C. 154(b) by 713 days.

(21) Appl. No.: 12/278,003

(22) PCT Filed: Feb. 14, 2007

(86) PCT No.: PCT/JP2007/053128
§ 371 (c)(1),
(2), (4) Date: Aug. 1, 2008

(87) PCT Pub. No.: WO2007/094507
PCT Pub. Date: Aug. 23, 2007

(65) Prior Publication Data
US 2009/0034203 A1   Feb. 5, 2009

(30) Foreign Application Priority Data

Feb. 15, 2006   (JP) .................................. 2006-038054
Aug. 3, 2006    (JP) .................................. 2006-211605

(51) Int. Cl.
*B22F 9/00*   (2006.01)
*C22C 9/00*   (2006.01)

(52) U.S. Cl.
USPC ............. 75/246; 148/407; 148/411; 148/423; 148/432; 148/668; 148/707; 419/28; 419/5; 361/708; 361/718; 420/428; 420/587

(58) Field of Classification Search
USPC ......... 148/407, 411, 419, 432, 435, 553, 554, 148/668, 679, 682, 683, 685, 686; 420/428, 420/469, 495, 587, 588; 419/28; 75/246
See application file for complete search history.

(56) References Cited

U.S. PATENT DOCUMENTS 6,524,525 B2 *  2/2003  Hauner et al. .................. 419/27
7,955,448 B2 *  6/2011  Terao et al. .................... 148/411
2009/0053090 A1 *  2/2009  Terao .............................. 419/29

FOREIGN PATENT DOCUMENTS

JP   5-38457 A    2/1993
JP   9-324230 A   12/1997

(Continued)

OTHER PUBLICATIONS

English Translation of Terao JP 2005-330583, Published Dec. 2, 2005, 32 pages.*
Mihara, K. et al, "Development of Cu-Cr In-Situ Composite," The Furukawa Electric Co., Ltd., Report, Jan. 2001, vol. 107, pp. 53-57, with English translation.

(Continued)

*Primary Examiner* — Roy King
*Assistant Examiner* — Christopher Kessler
(74) *Attorney, Agent, or Firm* — DLA Piper LLP (US)

(57) ABSTRACT

In a Cr—Cu alloy that is formed by powder metallurgy and contains a Cu matrix and flattened Cr phases, the Cr content in the Cr—Cu alloy is more than 30% to 80% or less by mass, and the average aspect ratio of the flattened Cr phases is more than 1.0 and less than 100. The Cr—Cu alloy has a small thermal expansion coefficient in in-plane directions, a high thermal conductivity, and excellent processability. A method for producing the Cr—Cu alloy is also provided. A heat-release plate for semiconductors and a heat-release component for semiconductors, each utilizing the Cr—Cu alloy, are also provided.

4 Claims, 1 Drawing Sheet

(56) References Cited

FOREIGN PATENT DOCUMENTS

| JP | 2000-239762 | A | | 9/2000 | |
|----|-------------|---|---|--------|---|
| JP | 2002-212651 | A | | 7/2002 | |
| JP | 2005-330583 | | * | 12/2005 | ............... C22F 1/08 |
| JP | 2005-330583 | A | | 12/2005 | |
| JP | 2006/112063 | A1 | | 10/2006 | |

OTHER PUBLICATIONS

Müller, R., "Arc-Melted CuCr Alloys as Contact Materials for Vacuum Interrupters," Siemens Forsch.- u. Entwickl.-Ber. Bd, 1988, vol. 17, No. 3, pp. 105-111.

German, R. M. et al., "Powder Metallurgy Processing of Thermal Management Materials for Microelectronic Applications," *The International Journal of Powder Metallurgy*, 1994, vol. 30, No. 2, pp. 205-215.

* cited by examiner

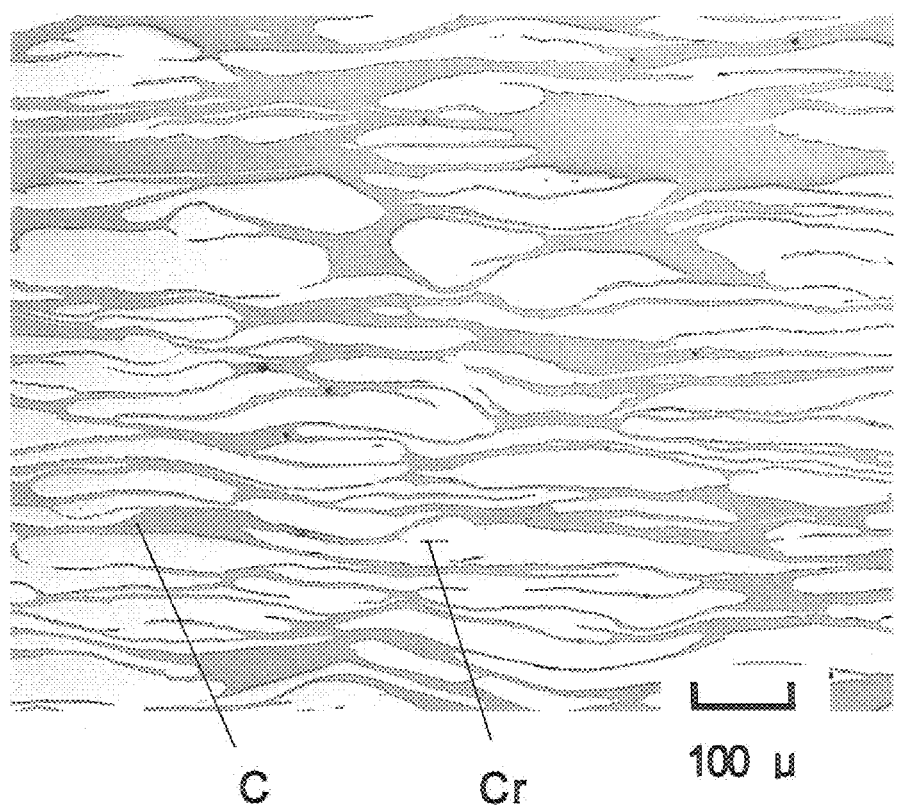

CR-CU ALLOY, METHOD FOR PRODUCING THE SAME, HEAT-RELEASE PLATE FOR SEMICONDUCTOR, AND HEAT-RELEASE COMPONENT FOR SEMICONDUCTOR

RELATED APPLICATIONS

This is a §371 of International Application No. PCT/JP2007/053128, with an international filing date of Feb. 14, 2007 (WO 2007/094507, published Aug. 23, 2007), which is based on Japanese Patent Application Nos. 2006-038054, filed Feb. 15, 2006, and 2006-211605, filed Aug. 3, 2006.

TECHNICAL FIELD

This disclosure relates to a heat-release plate for semiconductors (that is, heat-sink materials, heat-spreader materials), heat-release components (or heat-liberation components, thermal managing parts, or dissipation devices) for semiconductors, a Cr—Cu alloy serving as a material thereof, and a method for producing the Cr—Cu alloy. Such heat-release materials are used to rapidly dissipate heat generated by heat-generating bodies or parts, such as semiconductor chips, mounted on electronic devices, and therefore require a low thermal expansion coefficient and a high thermal conductivity.

The heat-release plate for semiconductors and the heat-release component for semiconductors are generally referred to herein as a heat-release material.

BACKGROUND

In operation of an electronic device that includes electronic components, such as semiconductor chips, the electronic components generate heat as electronic circuits are energized. The amount of heat generated during the operation increases with increasing power of an electronic device. An excessively high temperature may alter the characteristics of a semiconductor chip, resulting in unstable operation of the electronic device. Furthermore, an excessively high temperature for a long period of time may alter the quality of a bonding material (for example, solder) or an insulating material (for example, a synthetic resin) of an electronic component, resulting in failure of an electronic device. It is therefore necessary to rapidly dissipate heat generated by an electronic component. Thus, various techniques for dissipating heat with a heat-release material have been investigated.

A semiconductor chip may be directly fixed to a heat-release material. Alternatively, a semiconductor chip may be soldered or brazed to an aluminum nitride (AlN) substrate having directly-bonded Al electrodes (wherein the semiconductor chip being soldered or brazed to the al electrodes) (so-called DBA substrate), and then be fixed to a heat-release material by soldering or brazing. A heat-release material to be fixed with a DBA substrate must have a thermal expansion coefficient close to that of the DBA substrate, which is in the range of 5 to $7 \times 10^{-6}$ $K^{-1}$. As currently used heat-release materials, W—Cu based composite materials have a thermal expansion coefficient in the range of 6 to $9 \times 10^{-6}$ $K^{-1}$, and Mo—Cu based composite materials have a thermal expansion coefficient in the range of 7 to $14 \times 10^{-6}$ $K^{-1}$. A thermal expansion coefficient close to that of a target material can reduce the effect of thermal stress caused by a heat generated by semiconductor chip.

Furthermore, a heat-release material fixed to a DBA substrate is generally bonded to a dissipating fin (for example, formed of Al or Cu) by solder, brazing or with electroconductive grease.

A heat-release material requires a high thermal conductivity, as well as a low thermal expansion coefficient. However, it is difficult to achieve both of them at the same time. In many cases, therefore, a composite material composed of a material having a low thermal expansion coefficient and a material having a high thermal conductivity is used.

For example, Japanese Examined Patent Application Publication No. 5-38457 proposes metal-metal based composite materials, such as W—Cu and Mo—Cu. This technique utilizes a low thermal expansion coefficient of W or Mo and a high thermal conductivity of Cu.

Japanese Unexamined Patent Application Publication No. 2002-212651 discloses ceramic-metal based composite materials, such as SiC—Al and $Cu_2O$—Cu.

In these techniques, the thermal expansion coefficient is generally limited by the law (or rule) of mixtures (described below). More specifically, the thermal expansion coefficient of a composite material is in the vicinity of the volume average of the thermal expansion coefficients of component materials. Furthermore, in the case of W—Cu and Mo—Cu materials, W and Mo are rare metals and are targets for speculation. This increases the raw material costs and may cause shortages thereof. Furthermore, W—Cu and Mo—Cu materials require hot working. SiC—Al materials require difficult machining and reduction. $Cu_2O$—Cu materials also require hot working. Thus, it is difficult to produce a plate material by an inexpensive method. A further improvement is needed.

Japanese Unexamined Patent Application Publication No. 2000-239762 and "Development of Cu—Cr Multiphase Alloy," The Furukawa Electric Co., Ltd., Report, Vol. 107, January, 2001, pp. 53-57 disclose a technique for achieving a low thermal expansion coefficient and a high thermal conductivity in metal-metal composite materials, such as Cr—Cu and Nb—Cu. These documents disclose a technique in which a Cu alloy containing 2% to 50% by mass of Cr is shaped by a melting and casting method is subjected to hot working to produce generally spherical primary crystalline Cr phases of an ingot structure, and is further subjected to cold working (for example, paragraph [0014] in Japanese Unexamined Patent Application Publication No. 2000-239762) to adjust the aspect ratio of the Cr phases to be at least 10. These documents say that the technique can achieve a thermal expansion coefficient lower than that expected by the law of mixtures.

However, according to this technique, the thermal expansion coefficient is reduced only just by about 10% relative to that expected by the law of mixtures when the aspect ratio is as high as 100 of more ([0014] cited above). Adjusting the aspect ratio of the (generally spherical) Cr phases, which are primary deposited phases in a solidification process, to be 100 or more may require cold rolling at a reduction of about 90% or more.

In a melting and casting method, an increase in Cr content results in an increase in melting point. In addition, segregation during solidification makes it difficult to produce a homogeneous alloy. Actually, it is impractical to melt and cast a material containing more than 30% by mass of Cr and achieve an aspect ratio sufficient to greatly reduce the thermal expansion coefficient by cold working. Actually, "Development of Cu—Cr In-Situ Composite," The Furukawa Electric Co., Ltd., Report, Vol. 107, January, 2001, pp. 53- 57 and the examples of Japanese Un-examined Patent Application Publication No. 2000-239762 do not disclose an example containing more than 30% by mass of Cr.

Furthermore, a hot-forging or hot-rolling process, as well as homogenization heat treatment at a high temperature for a long period of time, is necessary to homogenize an alloy formed by the melting and casting method. This increases the manufacturing costs, and limits the dimensions of a heat-release material serving as a product.

Siemens Forsch.-Berd. Bd, 17, 1988, No. 3 discloses a technique for producing a homogeneous Cr—Cu alloy containing at least 30% by mass of Cr by melting and cold working. More specifically, a round bar is produced by casting utilizing an expensive arc-melting method (a melting and casting method utilizing arc discharge) using a sintered powder mix of Cr and Cu as a consumable electrode, and by extrusion to facilitate the deformation of Cr, which has insufficient ductility at room temperature. In the extrusion process, hydrostatic pressure is applied to Cr via a Cu matrix, thus facilitating the processing of Cr. This technique has a problem with economical efficiency, and is not suitable to produce a thin plate material, such as a heat-release material.

In Japanese Unexamined Patent Application Publication No. 2005-330583, as a technique for adapting a Cr—Cu material to a heat-release material, we disclose a technique for improving the thermal expansion coefficient of the Cr—Cu material by precipitating fine particulate Cr phases having a major axis of 100 mm or less from a Cu matrix by aging heat treatment. Among others, in a powder metallurgy process, a Cr powder is used for Cr—Cu alloying and making composite by sintering or infiltration, and particulate Cr phases are precipitated from a Cu matrix by aging heat treatment, as described above.

It has heretofore been difficult to fully accomplish the task of producing a thin plate material having a low thermal expansion coefficient and a high thermal conductivity. For example, the technique described in Japanese Unexamined Patent Application Publication No. 2000-239762 and "Development of Cu—Cr Multiphase Alloy," The Furukawa Electric Co., Ltd., Report, Vol. 107, January, 2001, pp. 53-57 is limited by processability and the Cr content. The technique described in Siemens Forsch.-Ber. Bd, 17, 1988, No. 3 needs considerable costs, even though a material can be processed.

While the technique described in Japanese Unexamined Patent Application Publication No. 2005-330583 is relatively excellent, there is a problem concerning the production of a thin plate material. Furthermore, according to that technique, Cr phases are randomly precipitated in three dimensions. Thus, the material has the same expansion coefficient in any direction. A heat-release material for semiconductors often has a thin plate shape. Thus, when such a heat-release material is joined to a semiconductor, the difference in thermal expansion coefficient must be reduced in in-plane directions. We have a view that the technique still leaves room for improvement.

Furthermore, that technique achieves a low thermal expansion coefficient only by controlling the state of the precipitated phase. Thus, depending on the condition for soldering or brazing between the heat-release material and a DBA substrate, for example, soldering or brazing at a high temperature beyond the aging temperature for a long period of time, the precipitated phase may change. This alters the characteristics of the heat-release material. Thus, it is likely that the heat-release material does not stably have a low thermal expansion coefficient.

It could therefore be advantageous to provide a Cr—Cu alloy having a low thermal expansion coefficient particularly in in-plane directions even after soldering, a high thermal conductivity, and excellent processability. It could also be helpful to provide a method for producing the Cr—Cu alloy. It could still further be helpful to provide a heat-release plate for semiconductors and a heat-release component for semiconductors, each comprising the Cr—Cu alloy.

SUMMARY

We provide a heat-release material (that is, a heat-release plate for semiconductors or a heat-release component for semiconductors) having a desired shape, particularly a plate shape, or a material for press forming. The heat-release material having a composition at which a homogeneous material is difficult to produce by an existing melting method can be produced at low cost by using a Cr powder as a raw material. Furthermore, a heat-release material having a further reduced thermal expansion coefficient can be produced by using a new process in which an infiltrated compact of a sintered Cr powder infiltrated with Cu is subjected to cold rolling.

The thermal expansion coefficient of a Cr—Cu alloy is known to follow the law of mixtures expressed by the equation (1) (see Japanese Unexamined Patent Application Publication No. 2000-239762):

$$\alpha_{alloy} = \alpha_{Cr} \times V_{Cr} + \alpha_{Cu} \times (1 - V_{Cr}) \tag{1}$$

$\alpha_{alloy}$: the thermal expansion coefficient of a Cr—Cu alloy
$\alpha_{Cr}$: the thermal expansion coefficient of Cr
$\alpha_{Cu}$: the thermal expansion coefficient of Cu
$V_{Cr}$: the volume fraction of Cr.

In practice, the thermal expansion coefficient of a Cr—Cu alloy does not follow the simple arithmetic mean calculated by the equation (1). Thus, there are various models that suggest a thermal expansion coefficient larger than that estimated by the equation (1), including that proposed by German (R. M. German et al., Int. J. Powder Metall., vol. 30 (1994), p. 205). Because a wide range of thermal expansion coefficients of Cr are published, it is difficult to estimate a correct thermal expansion coefficient of a Cr—Cu alloy. If the equation (1) applies by supposition, about 30% by mass or more of Cr is required to achieve a low thermal expansion coefficient suitable for a heat-release material (for example, $13 \times 10^{-6}$ K$^{-1}$). The production of a Cr—Cu alloy having such a high Cr content by an existing melting method involves a special method, such as the arc-melting method. This inevitably leads to an increase in manufacturing costs.

Thus, we employed powder metallurgy that can control the Cr content in a wide range, and have developed a technique in which a Cr powder or a mixed powder of Cr and Cu is sintered and infiltrated with Cu. Because sintering of a mixed powder of Cr and Cu, at a high temperature at which Cu melts substantially, generates the same state as infiltration, the separate infiltration process of Cu is not necessarily performed in such case. Sintering of a Cr powder followed by infiltration of Cu can easily produce a Cr—Cu alloy containing more than 30% to 80% or less by mass of uniformly distributed Cr.

Heretofore, it has been difficult to cold-roll such an infiltrated compact. We conducted cold rolling of an infiltrated compact, and found that a thermal expansion coefficient much lower than that estimated according to the law of mixtures can be achieved by forming Cr phases having an aspect ratio much lower than that described as being effective by Japanese Unexamined Patent Application Publication No. 2000-239762 by cold-rolling at a reduction of at least 10%.

We also found that heat treatment of such an infiltrated compact can consistently provide a low thermal expansion coefficient. More specifically, we found that the thermal expansion coefficient can be greatly reduced by, when necessary, heat-treating a Cr sintered compact infiltrated with Cu for homogenization and aging at a temperature in the range of 300° C. to 1050° C., cold-rolling the compact at a reduction of at least 10%, and heat-treating the compact for annealing and aging at a temperature in the range of 300° C. to 900° C.

A method using an as-sintered material or an as-infiltrated material is not suitable for many kinds of a small amount production, in which products having various shapes are required. In contrast, a Cr—Cu alloy can be easily processed to form plate shapes having various thicknesses, and can be subjected to punching in a press forming process. A Cr—Cu alloy is therefore adaptable to not only mass production, but also many kinds of a small amount production.

Additionally, in a Cr—Cu alloy, an infiltrated compact may contain a void. However, the void is crushed and close contact is achieved by cold rolling. This prevents a decrease in thermal conductivity due to the presence of a void.

We thus provide the following:

(1) A Cr—Cu alloy formed by powder metallurgy using a Cr powder, characterizing in that the Cr content is more than 30% to 80% or less by mass, the Cr—Cu alloy includes a Cu matrix and flattened Cr phases, and the average aspect ratio of the flattened Cr phases is more than 1.0 and less than 100.

(2) The Cr—Cu alloy according to (1), wherein the particle size of the Cr powder is in the range of 10 μm or more and 250 μm or less.

(3) The Cr—Cu alloy according to (1) or (2), wherein fine particulate second Cr phases having a major axis of 100 nm or less and an aspect ratio of less than 10 are precipitated from the Cu matrix, and the number density of the second Cr phases is at least $20/\mu m^2$.

Preferably, the number of the flattened Cr phases is 200/mm or less in the thickness direction.

(4) A heat-release plate for semiconductors or a heat-release component for semiconductors, in which a Cr—Cu alloy according to any one of (1) to (3) is utilized.

(5) A method for producing a Cr—Cu alloy, including the step of cold-rolling a material of Cr—Cu alloy containing a Cu matrix and Cr phases at a reduction of at least 10% to adjust the average aspect ratio of the Cr phases to be more than 1.0 and less than 100, wherein the Cr—Cu alloy contain more than 30% to 80% or less by mass of Cr and the remainder composed of Cu and unavoidable impurities.

(6) The method for producing a Cr—Cu alloy according to (5), further including the step of producing the material of Cr—Cu alloy using a Cr powder as a raw material.

(7) The method for producing a Cr—Cu alloy according to (6), wherein the particle size of the Cr powder is in the range of 10 μm or more and 250 μm or less.

Examples of the material of Cr—Cu alloy include infiltrated compacts described, in the following (8) to (12).

(8) A method for producing a Cr—Cu alloy, including the steps of: sintering a Cr powder to form a porous compact, and infiltrating the porous compact with Cu to form an infiltrated compact containing more than 30% to 80% or less by mass of Cr; and cold-rolling the infiltrated compact at a reduction of at least 10% to form a rolled material.

(9) A method for producing a Cr—Cu alloy, including: a sintering and infiltrating step of either (i) sintering a mixed powder compact of Cr and Cu, and further infiltrating the sintered compact with Cu to form an infiltrated compact containing more than 30% to 80% or less by mass of Cr; or (ii) sintering a mixed powder compact of Cr and Cu to form an infiltrated compact containing more than 30% to 80% or less by mass of Cr; and a step of cold-rolling the infiltrated compact at a reduction of at least 10% to form a rolled material.

(10) The method for producing a Cr—Cu alloy according to (8) or (9), further including the step of heating the rolled material at a temperature in the range of 300° C. to 900° C.

(11) The method for producing a Cr—Cu alloy according to any one of (8) to (10), further including the step of heating the infiltrated compact formed in the sintering and infiltrating step at a temperature in the range of 300° C. to 1050° C., before the cold-rolling step.

(12) The method for producing a Cr—Cu alloy according to any one of (8) to (11), wherein the particle size of the Cr powder is in the range of 10 μm or more and 250 g/m or less.

A Cr—Cu alloy is a so-called Cr—Cu composite material, which is composed of flattened Cr phases and a Cu phase (that is, a Cu matrix) containing a minute amount of Cr.

BRIEF DESCRIPTION OF DRAWINGS

FIG. 1 is a cross-sectional view of a Cr—Cu alloy structure.

DETAILED DESCRIPTION

Cr—Cu Alloy
Alloy Composition

First, the reason to select the Cr content in a Cr—Cu alloy will be described below.

Cr is an important element in achieving a low thermal expansion coefficient of a Cr—Cu alloy. A Cr content of 30% by mass or less cannot achieve a low thermal expansion coefficient (about $13 \times 10^{-6}$ $K^{-1}$ or less) required for a heat-release material (that is, a heat-release plate for semiconductors or a heat-release component for semiconductors). On the other hand, a Cr content of more than 80% by mass results in a decrease in thermal conductivity, and thereby cannot produce a sufficient heat-dissipation as a heat-release material. Accordingly, the Cr content is in the range of more than 30% to 80% or less by mass. Preferably, the Cr content is in the range of 40% or more and 70% by mass or less. More preferably, the Cr content is in the range of 45% or more and 65% or less by mass. Still more preferably, the Cr content is in the range of more than 50% and 65% by mass or less.

Preferably, the remainder is Cu and unavoidable impurities. A common amount of unavoidable impurities (for example, about 1% or less in total) causes no problem. For example, as main impurities, 0.03% by mass or less of S, 0.02% by mass or less of P, and 0.3% by mass or less of Fe cause no problem. Preferably, a material of Cr—Cu alloy (infiltrated compact) before rolling contains gas components (O, N, and C) in the range described below. Thus, a Cr—Cu alloy also contains substantially the same amount of gas components.

We found that a reduction in the content of impurities, particularly O, N, and C, in a material of Cr—Cu alloy (infiltrated compact) remarkably improves the processability in cold rolling. More specifically, we found that, when the O content is 0.08% by mass or less, the N content is 0.05% by mass or less, and the C content is 0.05% by mass or less, a sintered or infiltrated compact causes no crack at a reduction as high as 30% or more. More preferably, when the 0 content is 0.03% by mass or less, the N content is 0.020% by mass or less, and the C content is 0.01% by mass or less, a rolled material has no crack at a reduction as high as 60% or more.

A reduction in impurity content may improve not only the processability of a Cu main phase, but also the processability of Cr phases. A detailed mechanism is under investigation.

Furthermore, if a lower thermal expansion coefficient is desired, part or all of Cr may be replaced with Mo and/or W.

The structural characteristics of a Cr—Cu alloy will be described after the description of raw materials.

Raw Materials

A powder metallurgy technique is applied to a Cr raw material, a Cr powder. More specifically, a Cr powder (optionally mixed with a Cu powder) can be sintered and infiltrated with Cu to form a Cr—Cu alloy containing more than 30% by mass of uniformly distributed Cr.

Preferably, the Cr powder has a purity of at least 99% by mass. Furthermore, impurities in the Cr powder are preferably minimized in view of the processability of an infiltrated compact. In particular, O, N, and C have large influences. Thus, in large-scale processing, preferably, the O content is 0.15% by mass or less, the N content is 0.1% by mass or less, and the C content is 0.1% by mass or less. More preferably, the O content is 0.08% by mass or less, the N content is 0.03% by mass or less; and the C content is 0.03% by mass or less.

Preferably, the particle size of the Cr powder is 250 μm or less (in accordance with Japanese Industrial Standards (JIS) Z 2510) in view of the uniformity of the resulting alloy. However, a Cr powder having a small particle size has a large surface area and is easily oxidized. Thus, it is difficult to reduce the thermal expansion coefficient at a low reduction. Hence, more preferably, the particle size of the Cr powder is at least 10 μm.

The particle size of 250 μm or less means that particles that do not pass through 250 μm apertures (or openings) of a sieve conforming to JIS are eliminated. In the same manner, the particle size of at least 10 μm means that particles that pass through 10 μm apertures of a sieve conforming to JIS are eliminated.

The particle size of the Cr powder is more preferably in the range of 30 to 200 μm and most preferably in the range of 50 to 200 μm.

The aspect ratio of the Cr powder is ideally close to 1.0. However, the Cr powder having an aspect ratio in the range of 1.0 to 2.0 can be used without problems. The aspect ratio of the Cr powder is more preferably in the range of 1.0 to 1.5 and most preferably in the range of 1.0 to 1.2. The aspect ratio of the Cr powder, as used herein, refers to the average aspect ratio of Cr powder particles. More specifically, the aspect ratio is obtained by observing Cr powder particles, for example, scattered from above on a paper, determining the ratio of the major axis to the minor axis for each particle, and averaging the ratios. The aspect ratio of the Cr powder is different from the aspect ratio of an infiltrated compact or a rolled material calculated according to the equation (2).

Cu that is to be infiltrated into a sintered Cr powder compact is preferably a plate of metallic Cu, such as industrially manufactured tough-pitch copper, phosphor-deoxidized copper, or oxygen-free copper, or an industrially manufactured Cu powder, such as an electrolytic copper powder or an atomized copper powder. The diffusion of impurities from Cu to Cr impairs cold-rolling characteristics. Thus, the impurities in Cu should be reduced.

Structure of Alloy

In a Cr—Cu alloy, flattened Cr phases produced from a Cr powder raw material are present in a Cu matrix (produced from infiltrated Cu).

The average aspect ratio of the flattened Cr phases is more than 1.0 and less than 100. We found that, when the average aspect ratio is more than 1.0, preferably at least 1.4, a Cr—Cu alloy consistently has a low thermal expansion coefficient even after the Cr—Cu alloy is heated to a temperature as high as the soldering temperature or the aging heat treatment temperature described in Japanese Unexamined Patent Application Publication No. 2005-330583. An aspect ratio as high as 100 or more is laborious in terms of the number of rolling passes. Furthermore, it becomes difficult to form a thin plate shape required for a heat-release material. The aspect ratio of the flattened Cr phases is therefore less than 100.

The average aspect ratio of the flattened Cr phases is more preferably at least 2.0. As for an upper limit, the average aspect ratio is more preferably 30 or less, still more preferably 15 or less, and most preferably less than 10.

The aspect ratio of the Cr phases is determined by observing a cross section (a cross section along the rolling direction and the direction of reduction, or a cross section along the thickness direction in an infiltrated compact) under an optical microscope after the cold rolling of an infiltrated compact. The aspect ratio is calculated according to the equation (2). The average aspect ratio is determined as a mean value of the calculated aspect ratios. More specifically, the aspect ratio can be determined from Cr phases each entirely disposed within a field of view observed under an optical microscope of a magnification, for example, in the range of 50 to 100. Furthermore, when a plurality of Cr phases seem to coalesce into one phase, the average aspect ratio is determined from the aspect ratio of each individual Cr phase separated from each other.

$$\text{Aspect ratio} = L_1/L_2 \quad (2)$$

$L_1$: the maximum length of a cross section of a cold-rolled infiltrated compact (=rolled material) in the rolling direction $L_2$: the maximum length of a cross section of a cold-rolled infiltrated compact (=rolled material) in the direction of reduction While $L_1$=the major axis and $L_2$=the minor axis according to a general definition, the above-mentioned definition substantially applies to Cr phases deformed by rolling.

In an infiltrated compact not subjected to rolling, the aspect ratio is determined on the basis of the similar observation of any cross section along the thickness direction.

Preferably, the number of flattened Cr phases in the thickness direction (direction of reduction) is 200/mm or less. When the number of Cr phases in the thickness direction exceeds 200/mm, the thermal conductivity in the thickness direction reduces greatly. Thus, satisfactory heat-radiation performance as a heat-dissipating component cannot be achieved. Preferably, the number of flattened Cr phases in the thickness direction (direction of reduction) is 100/mm or less. Preferably, in view of the uniformity of an alloy, the number of flattened Cr phases in the thickness direction is at least 10/mm.

Furthermore, in a Cr—Cu alloy, in addition to the flattened Cr phases, fine particulate Cr phases are precipitated from the Cu matrix. These particulate Cr phases contribute to a further reduction in the thermal expansion coefficient.

Preferably, in terms of a reduction in thermal expansion coefficient, the number density of particulate Cr phases having a major axis of 100 nm or less and an aspect ratio of less than 10 is 20 μm². Fine Cr phases having a size and an aspect ratio outside these ranges contribute little to a reduction in thermal expansion coefficient.

The number of particulate Cr phases, as used herein, is determined by the following method. A specimen is observed with a scanning electron microscope (SEM) with a magnification in the range of about 10,000 to 300,000 at a low accelerating voltage in the range of 1 to 5 kV. The number density (/μm$^2$) is determined from the number of Cr phases within a field of view. The specimen is previously etched by the following method. A specimen is dipped in a solution of 10 g of potassium dichromate, 5 ml of sulfuric acid (96%), and 1 to 2 drops of hydrochloric acid (37%) in 80 ml of distilled water at room temperature for 3 to 15 seconds. The specimen is washed with water and is dried, thereby being ready for observation of fine Cr phases.

The particulate Cr phases are formed by precipitation of Cr from a Cu matrix by heat treatment before or after rolling.

Production Method

A method for producing a Cr—Cu alloy will be described below.

A method for producing a Cr—Cu alloy is characterized in that:

(a) a Cr powder used as a Cr raw material is sintered and infiltrated with Cu (or a mixed powder of Cr and Cu is compressed, is sintered, and, if necessary, is infiltrated with Cu) to uniformly distribute a large amount of Cr; and (b) a material of Cr—Cu alloy (infiltrated compact) produced in (a) is cold-rolled and, if necessary, is heat-treated, to reduce the thermal expansion coefficient of the infiltrated compact.

Production of Infiltrated Compact

In the production of a Cr—Cu alloy, a Cr powder raw material, alone or mixed with a Cu powder, is charged into a mold, is compressed if necessary, and is sintered. The sintered compact (hereinafter referred to generally as a porous compact) is infiltrated with Cu. For the convenience of description, gravity filling without compression is also referred to herein as compaction. Sintering and infiltration may be performed in a single step. However, when a mixed powder is sufficiently compressed to obviate the need for infiltration of Cu, the resulting compact is actually not a porous compact. In other words, the term "porous compact", as used herein, conforms to the common usage in the technical field of infiltration and refers to a compact having voids into which Cu can be infiltrated. A preferred porosity is in the range of 15% to 65% by volume, as determined by the mercury intrusion method (compliant with JIS R 1655).

In a compression process, a compacting pressure is controlled according to the composition of raw materials, filling property, and a target density. When a Cr powder is used alone, the infiltration of Cu must be performed later. When a mixed powder of Cr and Cu is sintered at high temperature (a temperature at which Cu is sufficiently annealed or melts), the infiltration process may be omitted. Sintering and infiltration may be performed simultaneously.

A process in which sintering and infiltration are performed separately or simultaneously is generally referred to as a sintering and infiltrating step.

Preferably, sintering is performed at a temperature in the range of 1000° C. to 1600° C. (desirably 1050° C. to 1450° C.) for 30 to 300 minutes in a hydrogen atmosphere or in a vacuum.

Infiltration may be performed conventionally. For example, a pure Cu plate or powder is placed on the top surface and/or the undersurface of a porous compact at a temperature in the range of 1100° C. to 1300° C. (desirably 1150° C. to 1250° C.) for 20 to 120 minutes preferably in a hydrogen atmosphere or in a vacuum. In view of the processability of an infiltrated compact, infiltration is preferably performed in a vacuum.

We found that the cooling rate after a mixed powder of Cr and Cu is sintered and infiltrated simultaneously, or the cooling rate after a porous compact of a sintered Cr powder or a sintered mixed powder of Cr and Cu is infiltrated with Cu, affects the thermal expansion coefficient of the infiltrated compact. More specifically, a cooling rate of 600° C./min or less is preferable to achieve a larger reduction in thermal expansion coefficient. While the reason that the thermal expansion coefficient varies with the cooling rate is not yet clear, it is believed that Cr dissolved in a Cu matrix during the sintering or infiltration step is precipitated differently from the Cu matrix by heat treatment in a manner that depends on the cooling rate.

Heat treatment for homogenization and aging

Before cold rolling of an infiltrated compact, if necessary, heat treatment for homogenization and aging is performed at a temperature preferably in the range of 300° C. to 1050° C. At a temperature of less than 300° C., no effect of homogenization and aging is produced. On the other hand, at a temperature of more than 1050° C., infiltrated Cu may melt and spill out. The hold time is preferably at least 30 minutes. More preferably, the temperature is in the range of 400° C. to 900° C.

The term "aging", as used herein, refers to the precipitation of particulate Cr. More specifically, when a Cr sintered compact is infiltrated with Cu (including the case of high temperature sintering of a Cr powder and a Cu powder), 0.1% to 2.0% by mass of Cr dissolves in Cu. Heat treatment is conducted so that Cr dissolved in the Cu matrix is precipitated as particulate Cr having a major axis of 100 nm or less and an aspect ratio of less than 10 from the Cu matrix. The precipitation of the Cr phases can further reduce the thermal expansion coefficient. Preferably, heat treatment for homogenization and aging is performed in a vacuum.

Cold Rolling

After infiltration and optional heat treatment, a Cr—Cu alloy is machined (for example, cutting with a milling machine or grinding with a whetstone) to remove an oxidized layer of the infiltrated compact or Cu remaining on the surface, and is then subjected to cold rolling. Cold rolling with a reduction can reduce the thermal expansion coefficient. Even a common, relatively low reduction rate in the range of 10% to 90% can reduce the thermal expansion coefficient.

Conventionally, it is known that Cr—Cu powder metallurgy products have low processability, and cold rolling often easily causes cracks. A Cr—Cu infiltrated compact has an improved processability such that cold rolling can be performed without problems. While the reason for that is not yet clear, this is probably because selection of optimum sintering and infiltrating conditions results in a reduced amount of gas components in the infiltrated compact.

Thus, we found that a reduction in O, N, and C contents remarkably improves cold processability. More specifically, we found that, when the O, N, and C contents in a Cr—Cu infiltrated compact are reduced to 0.08% by mass or less, 0.05% by mass or less, and 0.05% by mass or less, respectively, the infiltrated compact causes a greatly reduced occurrence of cracks at a reduction of 30% or more. Furthermore, we found that, when the O, N, and C contents in a Cr—Cu infiltrated compact are reduced to 0.03% by mass or less, 0.02% by mass or less, and 0.01% by mass or less, respectively, the infiltrated compact causes a reduced occurrence of cracks at a reduction of 60% or more.

As described above, an infiltrated compact or an infiltrated compact subjected to heat treatment for homogenization and aging can be easily cold-rolled. The thermal expansion coefficient can further be reduced by further cold-rolling an infiltrated compact to impart directionality to Cr phases and control the aspect ratio of the Cr phases. Cold rolling at a reduction of at least 10% is necessary to produce, this effect. As a result, Cr phases having an average aspect ratio of more than 1.0 are generated. When the aspect ratio of a Cr powder raw material is not 1.0, the average aspect ratio of Cr phases is thought to be approximately equal to the aspect ratio of the powder+0.1 or more. Furthermore, the reduction may also have an effect of imparting directionality to the fine particulate Cr phases in the Cu matrix. It is believed that this also contributes to a reduction in the thermal expansion coefficient of a rolled surface in in-plane directions.

We found that a low thermal expansion coefficient is stably maintained to a higher temperature as the reduction rate increases. Thus, the reduction rate is preferably set to be high particularly in case of brazing, in which a material is heated to a temperature as high as more than 800° C. The reduction rate is preferably at least 30% and more preferably at least 50%, in view of the stability of the thermal expansion coefficient at high temperatures. On the basis of the reduction rate, the average aspect ratio of the Cr phases is expected to be 1.4 at a reduction rate of 30% and 2.0 at a reduction rate of 50%. However, the actual average aspect ratio after rolling does not comply with above calculation in many cases, and is often greater than the predicted value. The actual average aspect ratio obtained from many experimental results by us was in the range of 110 to 24 at a reduction rate of 80%. This value is larger than the predicted value (5.0) and smaller than the square of the predicted value (25). Thus, it is actually believed that the average aspect ratio varies, up to the square of 1.4 at a reduction rate of 30% and the square of 2.0 at a reduction rate of 50%, for example.

A reduction of more than 99% requires a significantly large number of cold-rolling passes and therefore cold rolling for a long period of time. This considerably decreases the production efficiency of a heat-release material. In addition, this impairs the shape of a rolled material and reduces the precision of thickness. The reduction is therefore preferably 99% or less. Furthermore, a reduction of 90% or more may cause a crack at the edge of an infiltrated compact, resulting in a low process yield. The reduction is therefore more preferably less than 90%. Still more preferably, the upper limit of reduction rate is 80%.

The average aspect ratio of Cr phases is estimated to be approximately the square of 1.1, 10, and 100 when an infiltrated compact is cold-rolled at a reduction of 10%, 90%, and 99%, respectively.

While the reason that cold rolling of an infiltrated compact provides a much lower thermal expansion coefficient in in-plane directions than that expected on the basis of past findings is not yet clear, the following may have some effect:

A three-dimensional, geometrical effect of Cr phases resulting from cold rolling, which has not been applied to a Cu alloy of high Cr content.

The size, the number density, or the homogeneity of Cr phases achievable only by powder metallurgy using a powder having an appropriate particle size distribution.

Furthermore, the reduction of an infiltrated compact crushes remaining voids, thus preventing a reduction in thermal conductivity. Probably, this also contributes to the much lower thermal expansion coefficient.

Furthermore, biaxial rolling (so-called cross rolling) may be effective to reduce the in-plane anisotropy of a cold-rolled material.

The cold rolling, as described above, refers to plate rolling, in which a material is rolled with a long straight side of a roller to form a plate. Heat treatment for annealing and aging A cold-rolled Cr—Cu alloy is further subjected to heat treatment for annealing and aging to promote aging (precipitation of particulate Cu) as well as annealing. This can further reduce the thermal expansion coefficient and improve the thermal conductivity.

Preferably, heat treatment for annealing and aging is performed. Preferably, heat treatment for annealing and aging is performed at a temperature in the range of 300° C. to 900° C. At a temperature of less than 300° C., no effect of annealing and aging is produced. On the other hand, at a temperature of more than 900° C., infiltrated Cu may melt and spill out. The hold time is preferably at least 30 minutes. More preferably, the temperature is in the range of 400° C. to 800° C.

Furthermore, when a material is used as a member of high strength or high rigidity, heat treatment after cold rolling may be omitted. Furthermore, when a material is brazed, heating during a brazing process preferably in a vacuum has the same effect as heat treatment after cold rolling.

Japanese Unexamined Patent Application Publication No. 2005-330583 also discloses that fine particulate Cr precipitated by heat treatment for homogenization and aging or heat treatment for annealing and aging reduces the thermal expansion coefficient of a Cr—Cu alloy. However, the thermal expansion coefficient is further reduced, in combination with the effect of reducing the thermal expansion coefficient by cold rolling. While the reason that a combination of cold rolling and heat treatment for precipitation creates such a synergistic effect is not yet clear, it is possible that cold rolling before or after precipitation of Cr, which is dissolved in a Cu matrix during a sintering or infiltrating step, by heat treatment allows precipitated Cr phases to be oriented advantageously, thereby effectively reducing the thermal expansion, coefficient in in-plane directions.

This synergistic effect requires a reduction of at least 10%, preferably at least 30%. However, since a reduction of more than 99% has adverse effects on the productivity and other performance, as described above, the reduction is preferably 99% or less. More preferably, the reduction is less than 90% to prevent a crack at the edge of an infiltrated compact.

Applications

A Cr—Cu alloy may be processed into a heat-release plate for semiconductors and a heat-release component for semiconductors, each having a desired shape, by cutting or punching. Furthermore, the following treatments may be given to impart suitable characteristics to a Cr—Cu alloy.

A cold-rolled Cr—Cu heat-release plate may be used directly or after heat treatment. If necessary, a Cr—Cu heat-release plate may be plated with Ni, Au, or Ag, alone or in combination, to improve corrosion resistance and resistance to galvanic corrosion. Ni plating or Au plating allows joining by soldering or brazing.

A rolled material has a low thermal expansion coefficient at a temperature up to 800° C. or more. A material is therefore advantageously used in applications that involve brazing at a bonding temperature as high as 750° C. or more.

EXAMPLES

Example 1

A gravity-filled or compressed Cr powder (particle size: 50 to 200 μm) was sintered in a vacuum or in a hydrogen atmosphere to form a sintered compact (70 mm×70 mm×10 mm) having a porosity in the range of 25% to 55% by volume (corresponds to a Cr content in the range of 70% to 40% by mass after infiltration of Cu). The sintering temperature was in the range of 1200° C. to 1500° C. A Cu plate was placed on the sintered compact and was heated to 1200° C. in a vacuum to melt Cu. Thus the sintered compact was infiltrated with Cu to form an infiltrated compact.

Also, a Cr powder and a Cu powder were mixed and compressed to form a compact. A Cu plate was placed on the compact and was heated to 1200° C. in a vacuum to melt Cu. Thus the compact was sintered and infiltrated with Cu at the same time to form an infiltrated compact.

Some of these infiltrated compacts were heat-treated (heating temperature: 600° C.; hold time: one hour).

Cu remaining on the Cr—Cu alloys was removed with a milling machine to form Cr—Cu alloy plates having a thickness of 9 mm. The Cr—Cu alloy plates were cold-rolled to a thickness of 2.5 mm. The aspect ratio of Cr phases estimated from the reduction rate was in the range of about 3.6 to 13.

These Cr—Cu alloy plates were heat-treated (heating temperature 450° C. to 900° C.; hold time: one hour) to adjust the thermal expansion coefficient.

The average thermal expansion coefficient (rolling direction) was measured at temperatures ranging from room temperature to 200° C. The thermal expansion coefficient of a test specimen having a length of 20 mm was determined with a vertical dilatometer DL-7000 manufactured by ULVAC-RIKO, Inc. The average thermal expansion coefficient was calculated from variations in length of the test specimen at each temperature. Furthermore, the aspect ratio of flattened Cr phases in a cross-sectional sample in the rolling direction (for T to W, longitudinal direction of alloy plates) was determined.

Table 1 shows the results.

duced by a method have a thermal expansion coefficient lower than those of T to W, and have excellent characteristics as a heat-release material. In existing techniques, the Cr content must be increased to reduce the thermal expansion coefficient. This inevitably reduces the thermal conductivity. However, we can achieve both a low thermal expansion coefficient and a high thermal conductivity at the same time.

Observation with a scanning electron microscope described above showed that, in all the alloys A to W other than U, 25 to 100/μm$^2$ of fine particulate Cr phases having a major axis of 100 nm or less and an aspect ratio of less than 10 were precipitated from a Cu matrix.

Furthermore, the thermal conductivities of Examples A to Q and T and U were determined by a laser flash method. To adopt a laser flash method, Cr—Cu alloy plates having the same composition as A to Q and T were prepared and cold-rolled. The reduction rate of cold rolling was the same as that for alloy plates listed in Table 1. The thickness of the Cr—Cu alloy plates before cold rolling was changed such that the thickness after cold rolling was 2 mm or 0.8 mm (T and U were not cold-rolled, and were cut and ground to a final thickness). The thermal conductivity of a test specimen taken from thus-obtained Cr—Cu alloy plates having a thickness of 2 mm was determined in the thickness direction by a laser flash method. The thermal conductivity of a test specimen taken from the Cr—Cu alloy plates having a thickness of 0.8 mm was determined in in-plane directions by a substrate measurement method with laser flash. The thermal conduc-

TABLE 1

| | | Cr content (% by mass) | Heat treatment Before cold rolling | Heat treatment After cold rolling | Thermal expansion coefficient* (K$^{-1}$) | Average aspect ratio of Cr phases Estimate | Average aspect ratio of Cr phases Actual value | Note |
|---|---|---|---|---|---|---|---|---|
| Example | A | 50 | 600° C., 1 hr | — | 10.7 × 10$^{-6}$ | 3.6~13 | 11 | Single powder |
| | B | | | 450° C., 1 hr | 9.5 × 10$^{-6}$ | | 12 | Single powder |
| | C | | | 500° C., 1 hr | 10.5 × 10$^{-6}$ | | 10 | Single powder |
| | D | | | 550° C., 1 hr | 10.2 × 10$^{-6}$ | | 11 | Single powder |
| | E | | | 600° C., 1 hr | 9.0 × 10$^{-6}$ | | 11 | Single powder |
| | F | | | 650° C., 1 hr | 9.9 × 10$^{-6}$ | | 10 | Single powder |
| | G | | | 700° C., 1 hr | 10.0 × 10$^{-6}$ | | 9 | Single powder |
| | H | | | 750° C., 1 hr | 10.0 × 10$^{-6}$ | | 10 | Single powder |
| | I | | | 800° C., 1 hr | 9.9 × 10$^{-6}$ | | 11 | Single powder |
| | J | 50 | — | 450° C., 1 hr | 9.7 × 10$^{-6}$ | 3.6~13 | 12 | Mixed powder |
| | K | | | 500° C., 1 hr | 10.5 × 10$^{-6}$ | | 11 | Mixed powder |
| | L | | | 550° C., 1 hr | 10.8 × 10$^{-6}$ | | 11 | Mixed powder |
| | M | | | 600° C., 1 hr | 10.5 × 10$^{-6}$ | | 12 | Mixed powder |
| | N | | | 650° C., 1 hr | 10.9 × 10$^{-6}$ | | 10 | Mixed powder |
| | O | | | 700° C., 1 hr | 9.5 × 10$^{-6}$ | | 9 | Mixed powder |
| | P | | | 750° C., 1 hr | 10.4 × 10$^{-6}$ | | 11 | Mixed powder |
| | Q | | | 800° C., 1 hr | 10.4 × 10$^{-6}$ | | 10 | Mixed powder |
| | R | 40 | 650° C., 1 hr | 600° C., 1 hr | 10.5 × 10$^{-6}$ | 3.6~13 | 7 | Mixed powder |
| | S | 70 | 500° C., 1 hr | 700° C., 1 hr | 8.5 × 10$^{-6}$ | 3.6~13 | 13 | Mixed powder |
| Comparative Example | T | 50 | Without cold rolling, heat treatment at 600° C. for 1 h | | 11.5 × 10$^{-6}$ | 1.0 | 1.0 | Single powder |
| | U | 50 | Without cold rolling, without heat treatment | | 13.0 × 10$^{-6}$ | 1.0 | 1.1 | Single powder |
| | V | 40 | Without cold rolling, heat treatment at 450° C. for 1 h | | 12.3 × 10$^{-6}$ | 1.0 | 1.1 | Mixed powder |
| | W | 70 | Without cold rolling, heat treatment at 620° C. for 1 h | | 10.2 × 10$^{-6}$ | 1.0 | 1.4 | Mixed powder |

*The thermal expansion coefficient is a mean value of from room temperature to 200° C.

Even in an infiltrated compact without cold rolling (T to W: a predicted average aspect ratio of Cr phases in a cross section of an infiltrated compact is 1.0), fine Cr phases precipitated from a Cu matrix by heat treatment give a thermal expansion coefficient lower than that predicted by the law of mixtures by German et al. Materials having the same composition protivity thus estimated in the thickness direction was about 150 W/m·K. The thermal conductivity in in-plane directions was about 200 W/m·K. Thus, the Cr—Cu alloy plates had a high thermal conductivity in each direction. T had a thermal conductivity of about 180 W/m·K in in-plane directions and the thickness direction. Furthermore, U, which was not heat-treated before nor after rolling, had a thermal conductivity of about 140 W/m·K in in-plane directions and the thickness direction.

Besides these, the bonding state of a specimen soldered to a semiconductor chip as a heat-release body for semiconductors was investigated. An infiltrated compact of Example was processed to a thickness of 5 mm, and was cold-rolled to form a Cr—Cu alloy plate (having a thickness of 0.8 mm). The Cr—Cu alloy plate was pressed into 10 mm×5 mm×0.8 mm, and was plated with electrolytic nickel having a thickness of 3 μm and then with Au having a thickness of 2 μm. The Cr—Cu alloy plate was soldered to a metallized 5 mm×3 mm×1 mm alumina plate having a Ni+Au plated surface (solder: Sn—3% by mass of Ag—0.5% by mass of Cu). No failure was observed at the bonded part.

This demonstrated that a Cr—Cu alloy can be used in a chip plate for high-frequency devices including silicon semiconductors or GaAs semiconductors for use in various types of professional radio sets and amateur radio sets, as well as GSM/AMP car phones, broadband wireless Internet connection modules and the like, and a chip plate for a base, a plate, or a high-brightness LED.

Next, a Cr—Cu alloy plate (having a thickness of 2.5 mm) of Example E was processed into 50 mm×100 mm×2.5 mm, and was plated with Ni having a thickness of 5 μM. The Cr—Cu alloy plate was soldered to a DBA substrate and a semiconductor chip by reflow treatment at a temperature up to 245° C. (solder: Sn—3% by mass of Ag—0.5% by mass of Cu).

This cooling substance for electronic component was subjected to a thermal shock test (heating temperature: −40° C., 120° C., hold time: 5 min.). The thermal shock test was performed in a WINTEC LT20-type liquid thermal shock chamber (Kusumoto Chemicals, Ltd.). After the test was completed, the presence of a crack was examined by ultrasonic flaw inspection.

A cooling substance for electronic component of Example had no detachment at a bonded interface or no crack after 3000 cycles.

This demonstrated that a Cr—Cu alloy can be used as a heat-release plate for power device semiconductors for use in inverters or the like.

As described above, a Cr—Cu alloy has both a low thermal expansion coefficient and a high thermal conductivity, and is a suitable material for a heat-release plate for semiconductors or a heat-release component for semiconductors.

Example 2

The same Cr powder as in Example 1 was gravity-filled and sintered in a vacuum or in a hydrogen atmosphere to form a sintered compact (70 mm×70 mm×10 mm) having a porosity of 45% by volume (corresponds to a Cr content of 50% by mass after infiltration of Cu). The sintering temperature was in the range of 1200° C. to 1500° C. A Cu plate was placed on the sintered compact and was heated to 1200° C. in a vacuum to melt Cu. The sintered compact was infiltrated with Cu to form an infiltrated compact.

Also a Cr powder and a Cu powder were mixed and compressed to form a compact. A Cu plate was placed on the compact and was heated to 1200° C. in a vacuum to melt Cu. The compact was sintered and infiltrated with Cu at the same time to form an infiltrated compact.

These infiltrated compacts were heat-treated (heating temperature: 600° C.; hold time: one hour). Cu remaining on the Cr—Cu alloys was removed with a milling machine to form Cr—Cu alloy plates having a thickness of 9 mm. The resulting Cr—Cu alloy plates were cold-rolled to a thickness of 5 or 2.5 mm. These correspond to reduction rates of 44% and 72%, respectively. After cold rolling, the surface of a Cr—Cu alloy plate was visually inspected for a crack. Table 2 shows the results.

TABLE 2

|  |  | Content in Cr powder (% by mass) | | | Content in infiltrated compact (% by mass) | | | Reduction rate | | |
| --- | --- | --- | --- | --- | --- | --- | --- | --- | --- | --- |
|  |  | O | N | C | O | N | C | (%) | Crack | Note |
| Example | a | 0.1 | 0.05 | 0.05 | 0.04 | 0.02 | 0.005 | 44 | None | Single powder |
|  | b | 0.1 | 0.05 | 0.05 | 0.06 | 0.04 | 0.02 | 44 | None | Mixed powder |
|  | c | 0.07 | 0.02 | 0.01 | 0.01 | 0.008 | 0.002 | 72 | None | Single powder |
|  | d | 0.07 | 0.02 | 0.01 | 0.02 | 0.015 | 0.008 | 72 | None | Mixed powder |
| Example | e | 0.2 | 0.05 | 0.15 | 0.09 | 0.04 | 0.06 | 44 | Edge crack | Single powder |
|  | f | 0.1 | 0.15 | 0.05 | 0.04 | 0.08 | 0.005 | 44 | Edge crack | Mixed powder |

As is clear from Table 2, Examples a to d had no crack, whereas Examples e and f had edge crack.

Example 3

The same Cr powder as in Example 1 was gravity-filled and sintered in a vacuum to form a sintered compact (70 mm×70 mm×10 mm) having a porosity of 50% by volume (corresponds to a Cr content of 45% by mass after infiltration of Cu). The sintering temperature was in the range of 1200° C. to 1500° C. A Cu plate was placed on the sintered compact and was heated to 1200° C. in a vacuum to melt Cu. The sintered compact was infiltrated with Cu to form an infiltrated compact. These infiltrated compacts were divided into five groups of Nos. 1 to 5. Some of them were heat-treated (heating temperature: 600° C.; hold time: one hour).

Cu remaining on the Cr—Cu alloys was removed with a milling machine to form Cr—Cu alloy plates having a thickness in the range of 1.6 to 6 mm. Some of Cr—Cu alloy plates were further cold-rolled to a thickness of 1.6 mm. In the same way as Example 1, the average thermal expansion coefficient (rolling direction) was measured at temperatures ranging from room temperature to 200° C.

Conditions for sample treatment are as follows:

| No. | Heat treatment | Thickness after cutting | Cold rolling | Thermal expansion coefficient |
|---|---|---|---|---|
| 1 | Treated | 6 mm | Rolled | $9.7 \times 10^{-6} K^{-1}$ |
| 2 | Untreated | 6 mm | Rolled | $10.1 \times 10^{-6} K^{-1}$ |
| 3 | Treated | 3.2 mm | Rolled | $9.8 \times 10^{-6} K^{-1}$ |
| 4 | Untreated | 3.2 mm | Rolled | $10.3 \times 10^{-6} K^{-1}$ |
| 5 | Untreated | 1.6 mm | Not rolled | $12.5 \times 10^{-6} K^{-1}$ |

Cold rolling of Nos. 1 and 2 corresponds to a reduction rate of about 73%. Cold rolling of Nos. 3 and 4 corresponds to a reduction rate of 50%. As is clear from these results, even in the absence of heat treatment, cold rolling of 50% (No. 4) or 73% (No. 2) improves (reduces) the thermal expansion coefficient by 18% to 19% relative to a non-rolled alloy (No. 5). Further heat treatment improves the thermal expansion coefficient thereby improving by about 22% in total.

After cold rolling, a cross-sectional sample in the rolling direction (for No. 5, longitudinal direction of an alloy plate) was taken and observed with an optical microscope. The aspect ratio of flattened Cr phases and the number of flattened Cr phases in the thickness direction were determined. FIG. 1 shows an observation with an optical microscope (No. 1: a portion at half-depth in the thickness direction, without etching). FIG. 1 shows flattened Cr phases in a Cu matrix (Particulate Cu phases cannot be discriminated with an optical microscope. Black spots are residual abrasive particles). Observed aspect ratios were about 10 for Nos. 1 and 2, about 3.5 for Nos. 3 and 4, and 1.0 for No. 5. Predicted aspect ratios at reduction s of 50% and 73% were in the ranges of 2.0 to 4.0 and 3.7 to 13.7. The observed aspect ratios were within the predicted aspect ratios. The numbers of flattened Cr phases in the thickness direction were about 30/mm for Nos. 1 and 2 and about 20/mm for Nos. 3 and 4.

Observation with a scanning electron microscope described above showed that, only in Nos. 1 and 3, about 30 to $50/\mu m^2$ of fine particulate Cr phases having a major axis of 100 nm or less and an aspect ratio of less than 10 (about 5 on average) were precipitated from a Cu matrix.

Industrial Applicability

A Cr—Cu alloy having a low thermal expansion coefficient, a high thermal conductivity, and excellent processability can be produced. A heat-release plate for semiconductors and a heat-release component for semiconductors can also be produced using the Cr—Cu alloy.

The invention claimed is:

1. A Cr—Cu alloy formed by powder metallurgy with a Cr powder, wherein
    Cr content is more than 30% to 80% or less by mass,
    the Cr—Cu alloy comprises flattened Cr phases directionally aligned along major axes of the flattened Cr phases in a Cu matrix,
    the average aspect ratio of the flattened Cr phases is more than 1.0 and less than 100,
    particle size of the Cr powder is in a range of 10 μm or more and 250 μm or less,
    fine particulate second Cr phases having a major axis of 100 nm or less and an aspect ratio of less than 10 are precipitated from the Cu matrix, and number density of the second Cr phases is at least 20 $\mu m^2$,
    in a plate shape having a thickness direction, wherein a number of flattened Cr phases is 200/mm or less in the thickness direction, and
    a thermal expansion coefficient of $13 \times 10^{-6}$ $K^{-1}$ or less.

2. A heat-release plate for semiconductors, utilizing a Cr—Cu alloy according to claim 1.

3. A heat-release component for semiconductors, utilizing a Cr—Cu alloy according to claim 1.

4. The Cr—Cu alloy formed by powder metallurgy with a Cr powder according to claim 1, wherein the alloy is cold-rolled.

* * * * *